US008648467B2

(12) United States Patent
Baba

(10) Patent No.: US 8,648,467 B2
(45) Date of Patent: Feb. 11, 2014

(54) SEMICONDUCTOR MEMORY DEVICE AND METHOD OF MANUFACTURING THE SAME

(75) Inventor: Yasuyuki Baba, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/458,141

(22) Filed: Apr. 27, 2012

(65) Prior Publication Data

US 2012/0299063 A1      Nov. 29, 2012

(30) Foreign Application Priority Data

May 26, 2011   (JP) ................................. 2011-118158

(51) Int. Cl.
*H01L 23/528* (2006.01)
*H01L 21/44* (2006.01)

(52) U.S. Cl.
USPC ........... 257/758; 257/211; 257/773; 257/775; 257/776; 438/622; 438/666

(58) Field of Classification Search
USPC ...................... 257/5; 438/128, 672
See application file for complete search history.

(56) References Cited

U.S. PATENT DOCUMENTS

| | | | |
|---|---|---|---|
| 8,044,456 B2 * | 10/2011 | Nagashima et al. | 257/326 |
| 8,084,830 B2 * | 12/2011 | Kanno et al. | 257/379 |
| 8,102,699 B2 * | 1/2012 | Toda | 365/148 |
| 8,183,602 B2 * | 5/2012 | Tabata et al. | 257/211 |
| 8,207,613 B2 * | 6/2012 | Okukawa et al. | 257/773 |
| 8,222,677 B2 * | 7/2012 | Baba et al. | 257/211 |
| 8,369,130 B2 * | 2/2013 | Maejima | 365/148 |
| 8,369,151 B2 * | 2/2013 | Yoneya et al. | 365/185.18 |
| 8,378,331 B2 * | 2/2013 | Satoh et al. | 257/2 |
| 8,384,059 B2 * | 2/2013 | Toda | 257/2 |
| 8,385,104 B2 * | 2/2013 | Maejima | 365/148 |
| 8,441,040 B2 * | 5/2013 | Minemura et al. | 257/210 |
| 2009/0134432 A1 * | 5/2009 | Tabata et al. | 257/211 |
| 2009/0219750 A1 * | 9/2009 | Tokiwa et al. | 365/148 |
| 2009/0231899 A1 * | 9/2009 | Park | 365/63 |
| 2009/0267047 A1 * | 10/2009 | Sasago et al. | 257/4 |
| 2010/0032725 A1 * | 2/2010 | Baba et al. | 257/211 |
| 2010/0038616 A1 * | 2/2010 | Nagashima et al. | 257/2 |
| 2010/0237512 A1 * | 9/2010 | Okukawa et al. | 257/786 |
| 2011/0068373 A1 * | 3/2011 | Minemura et al. | 257/210 |
| 2011/0204309 A1 * | 8/2011 | Nitta | 257/2 |

(Continued)

FOREIGN PATENT DOCUMENTS

| | | |
|---|---|---|
| JP | 2009-283498 | 12/2009 |
| JP | 2010-171332 | 8/2010 |

*Primary Examiner* — David Vu
*Assistant Examiner* — Earl Taylor
(74) *Attorney, Agent, or Firm* — Oblon, Spivak, McClelland, Maier & Neustadt, L.L.P.

(57) ABSTRACT

A method of manufacturing a semiconductor memory device according to the embodiment includes: forming a first stacked-structure; forming a first stripe part and a first hook part at the first stacked-structure; forming a second stacked-structure on the first stacked-structure; forming a second stripe part and a second hook part at the second stacked-structure; repeating the above-described four steps for a certain number of times; and forming a contact plug contacting the first or second hook parts. The etching is conducted to remove the first stacked-structure in a region at which the second hook part is to be formed in the second stacked-structure higher than the first stacked-structure by one layer. The etching is conducted to remove the second stacked-structure in a region at which the first hook part is to be formed in the first stacked-structure higher than the second stacked-structure by one layer.

20 Claims, 13 Drawing Sheets

(56) References Cited

U.S. PATENT DOCUMENTS

| | | | |
|---|---|---|---|
| 2011/0233505 A1* | 9/2011 | Nitta | 257/3 |
| 2012/0018697 A1* | 1/2012 | Nakajima | 257/5 |
| 2012/0205612 A1* | 8/2012 | Tabata et al. | 257/5 |
| 2012/0299063 A1* | 11/2012 | Baba | 257/208 |
| 2013/0044531 A1* | 2/2013 | Baek et al. | 365/72 |

* cited by examiner

SEMICONDUCTOR MEMORY DEVICE AND METHOD OF MANUFACTURING THE SAME

CROSS REFERENCE TO RELATED APPLICATION

This application is based upon and claims the benefit of priority from prior Japanese Patent Application No. 2011-118158, filed on May 26, 2011, the entire contents of which are incorporated herein by reference.

BACKGROUND

1. Field

Embodiments described herein relate to a semiconductor memory device and a method of manufacturing the same.

2. Description of the Related Art

As a semiconductor device has been highly integrated recently, the circuit pattern of a transistor or the like constituting the semiconductor device is increasingly miniaturized. The miniaturization of the pattern requires not only a thinner line but also the increase in the size accuracy and position accuracy of the pattern. A semiconductor memory device requires the same.

Semiconductor memory devices that have been already known and commercially available such as DRAM, SRAM and flash memory use a MOSFET as a memory cell. Thus, with the miniaturization of the pattern, the pace of the improvement of the size accuracy needs to be more than that of the miniaturization. Thus, the difficulty of lithography technique to form the patterns causes the production cost to increase.

A resistance change memory has been recently gaining attention as a replacement for semiconductor memory devices using such a MOSFET as a memory cell. In the resistance change memory, a cross-point cell structure may be adapted, in which a memory cell is formed at the intersection of a bit line and a word line. Thus, the memory cell can be miniaturized more easily than the conventional memory cells and also can be stacked in a vertical direction. Accordingly, the memory cell array integration can be easily improved.

However, in a semiconductor memory device having such a cross-point cell structure, it is desirable to form an accurate wiring structure for connecting with the peripheral circuit without the risk of short-circuit or the like.

DETAILED DESCRIPTION

A method of manufacturing a semiconductor memory device according to the embodiment, comprising a plurality of first lines, a plurality of second lines crossing the plurality of first lines, and a cell array having memory cells, each of the memory cells being connected with the first line and the second line at respective intersections of the first lines and the second lines, the method includes: forming a first stacked-structure by sequentially stacking a first line layer forming the first line and a memory cell layer forming the memory cell; forming a first stripe part and a first hook part at the first stacked-structure by etching the first stacked-structure into a stripe pattern extending in a first direction, the first stripe part extending in the first direction and being aligned at a certain pitch in a second direction perpendicular to the first direction, and the first hook part protruding from a side of the first stripe part in the second direction; forming a second stacked-structure on the first stacked-structure by sequentially stacking a second line layer forming the second line and the memory cell layer; forming a second stripe part and a second hook part at the second stacked-structure by etching the second stacked-structure into a stripe pattern extending in the second direction, the second stripe part extending in the second direction and being aligned at a certain pitch in the first direction, and the second hook part protruding from a side of the second stripe part in the first direction; repeating the above-described four steps for a certain number of times; and forming a contact plug contacting a side of the first hook part or a side of the second hook part and extending in a stacking direction perpendicular to the first direction and the second direction.

When there is the second stacked-structure under the first stacked-structure in etching the first stacked-structure, the second stacked-structure is also etched into a stripe pattern extending in the first direction to form the memory cell into a matrix pattern in the second stacked-structure. When there is the first stacked-structure under the second stacked-structure in etching the second stacked-structure, the first stacked-structure is also etched into a stripe pattern extending in the second direction to form the memory cell into a matrix pattern in the first stacked-structure.

In etching the first stacked-structure, the etching is conducted to remove the first stacked-structure in a region at which the second hook part is to be formed in the second stacked-structure higher than the first stacked-structure by one layer. In etching the second stacked-structure, the etching is conducted to remove the second stacked-structure in a region at which the first hook part is to be formed in the first stacked-structure higher than the second stacked-structure by one layer.

The embodiments of the present invention will be described below with reference to the drawings.

Figure 1:
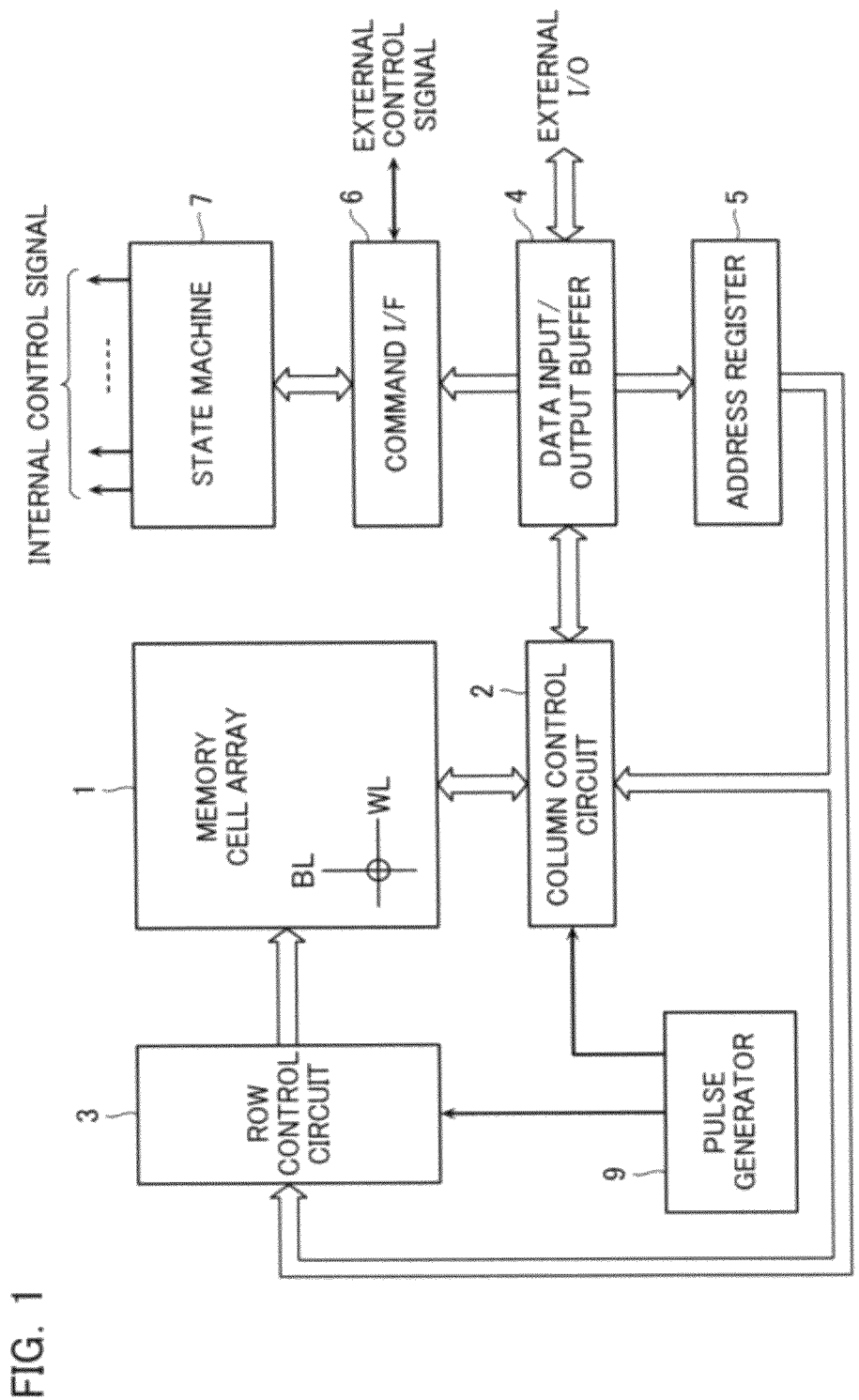
FIG. 1 is a block diagram of a semiconductor memory device (nonvolatile memory) according to an embodiment.

First, the schematic configuration of a semiconductor memory device according to the embodiment will be described with reference to FIGS. 1 to 4. FIG. 1 is a block diagram of the semiconductor memory device (nonvolatile memory) according to the embodiment.

As shown in FIG. 1, the semiconductor memory device according to the embodiment includes a memory cell array 1. The memory cell array 1 has memory cells using ReRAM (variable resistor) later described and placed in a matrix pattern. A column control circuit 2 is placed at the position adjacent to the memory cell array 1 in a bit line BL direction. The column control circuit 2 controls the bit lines BL in the memory cell array 1 to erase, read and write data from/into the memory cells.

A row control circuit 3 is placed at the position adjacent to the memory cell array 1 in a word line WL direction. The row control circuit 3 selects a word line WL in the memory cell array 1 to apply, to the word line, the voltage necessary to erase, read and write data from/into the memory cells.

A data input/output buffer 4 is connected with an external host (not shown) via an input/output line to receive write data, erase instructions, address data and command data, and to output read data. The data input/output buffer 4 transmits the received write data to the column control circuit 2, receives read data from the column control circuit 2, and outputs the read data to the external host. The address provided from the external host to the data input/output buffer 4 is transmitted via an address register 5 to the column control circuit 2 and the row control circuit 3. The command provided from the external host to the data input/output buffer 4 is transmitted to a command interface 6.

The command interface 6 receives an external control signal from the external host and determines whether the data input into the data input/output buffer 4 is write data, a command or an address. When the input data is a command, the command interface 6 transfers the input data as a received command signal to a state machine 7. The state machine 7 manages the whole of the memory. The state machine 7 receives a command from the external host and conducts, for example, reading, writing, erasing, and managing the input/output of the data. The external host may receive status information managed by the state machine 7 and determine the operation result. The status information is also used to control writing and erasing.

The state machine 7 also controls a pulse generator 9. The control allows the pulse generator to output a pulse at a certain voltage and a certain timing. Here, the generated pulse may be transferred to any wire selected in the column control circuit 2 and the row control circuit 3.

Note that peripheral circuit devices other than the memory cell array 1 may be formed on the Si substrate that is located just under the memory cell array 1 formed in a wiring layer. This allows the chip area of the nonvolatile memory to be nearly equal to that of the memory cell array 1.

Figure 2A:
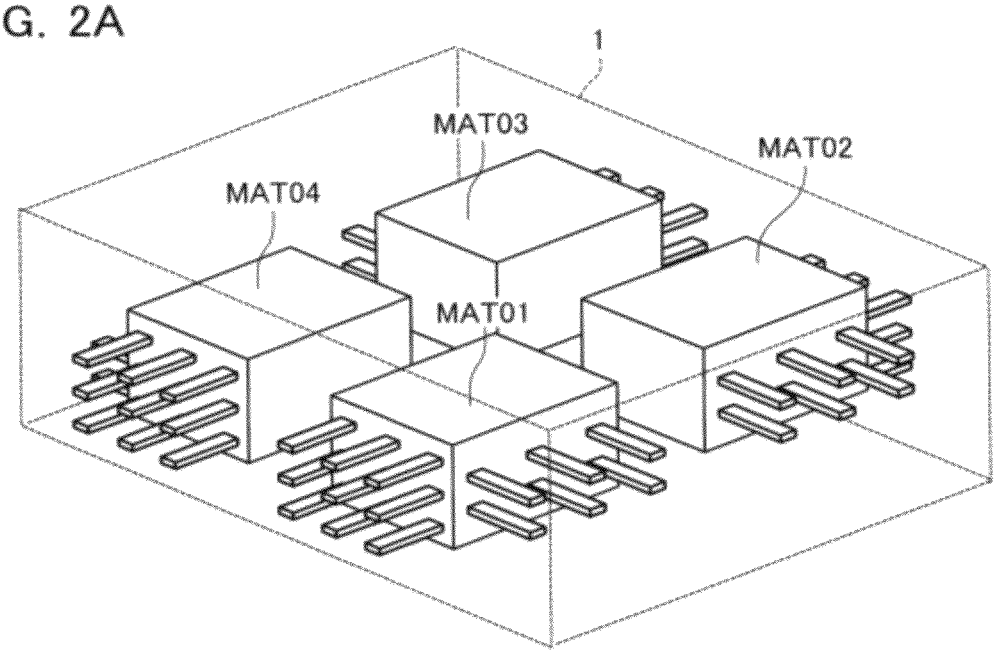
FIG. 2A is a perspective view of a memory cell array (unit memory cell arrays MAT01 to MAT04) of a semiconductor memory device according to an embodiment.
Figure 2B:
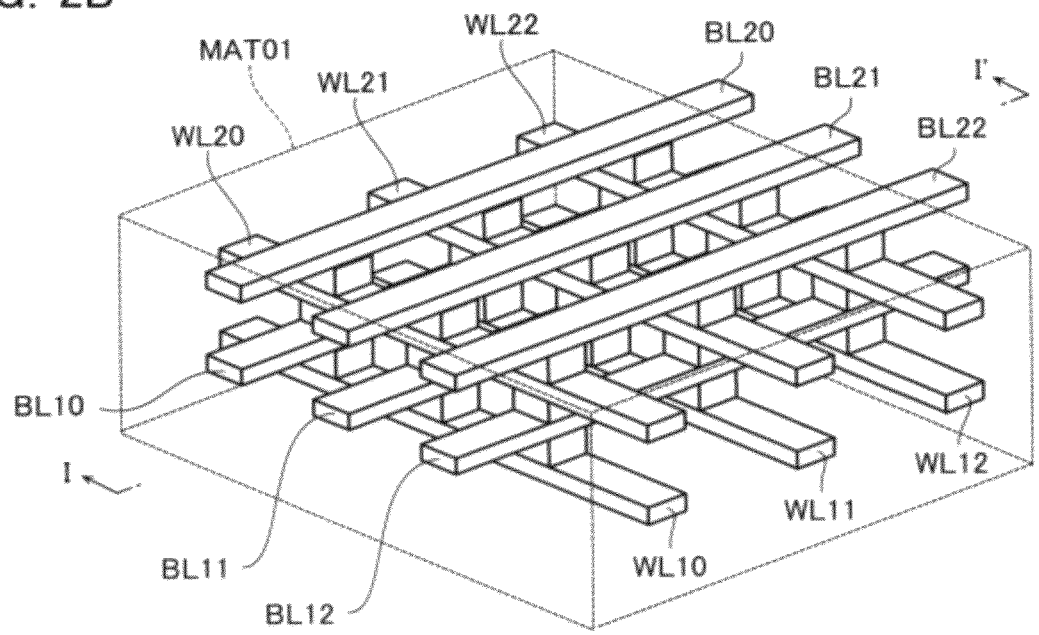
FIG. 2B is a partially enlarged perspective view of the memory cell array 1 shown in FIG. 2A.
Figure 3A:
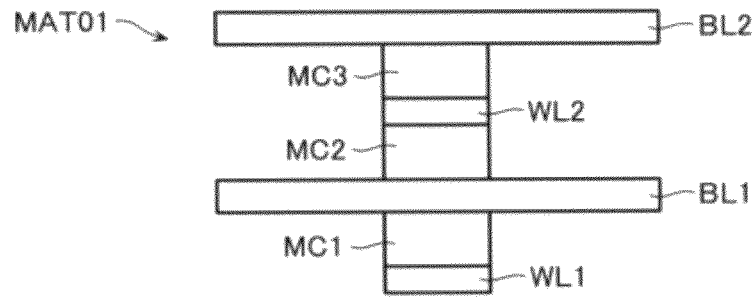
FIG. 3A is a cross-sectional view taken along the line I-I' of FIG. 2B.

FIG. 2A is a perspective view of the memory cell array 1. FIG. 2B is a partially enlarged perspective view of the memory cell array 1. FIG. 3A is a cross-sectional view of one memory cell cut on the line I-I' of FIG. 2B and viewed in the arrow direction.

As shown in FIG. 2A, the memory cell array 1 is divided into four unit cell arrays MAT01 to MAT04. Each of the unit cell arrays MAT01 to MAT04 is a part of the memory cell array 1. The unit cell arrays MAT01 to MAT04 are two-dimensionally placed as shown in FIG. 2A. Note that FIG. 2A is an example and the memory cell array 1 may include four or more unit cell arrays or may include unit cell arrays that are stacked in a three-dimensional direction.

As shown in FIG. 2B, the unit cell array MAT01 includes a plurality of word lines $WL1i$ (i=0 to 2), bit lines $BL1i$, word lines $WL2i$, and bit lines $BL2i$ that are stacked from the bottom to the top. The bit lines BL1 extend in the same direction (column direction). The word lines WL extend in a direction perpendicular to (crossing) the bit lines BL (row direction). In FIG. 2B, although three memory cells MC are stacked among the two bit lines BL and the two word lines WL that are stacked as an example, the number of the word lines WL, the bit lines BL and the memory cells MC that are formed in a stacking direction are not limited to those shown in FIG. 2B.

As shown in FIG. 3A, the memory cells MC1 to MC3 are formed at the intersections of the word lines WL and the bit lines BL. The bit line $BL1i$ is shared by the memory cells MC1 and MC2 that are located at the upside and the downside thereof. The word line $WL2i$ is shared by the memory cells MC2 and MC3 that are located at the upside and the downside thereof.

Figure 3B:
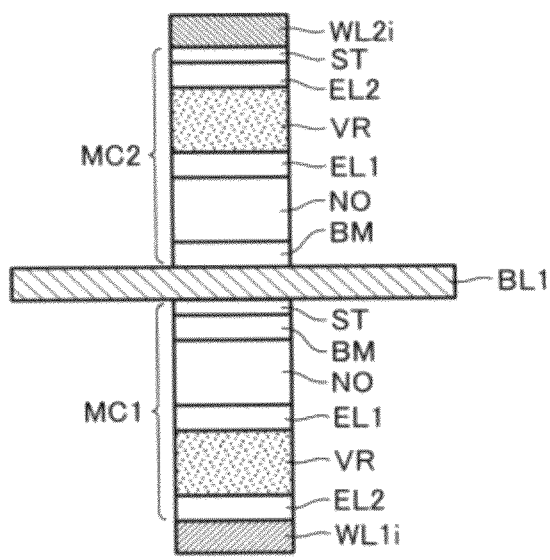
FIG. 3B is a cross-sectional view of memory cells MC1 and MC2.

As shown in FIG. 3B, the memory cells MC include a variable resistor VR and a non-ohmic element NO connected in series. FIG. 3B shows the memory cells MC1 and MC2.

As shown in FIG. 3B, the memory cell MC1 includes a stopper film ST, a barrier metal BM, a non-ohmic element NO, an electrode EL1, a variable resistor VR, and an electrode EL2, which are stacked in a direction from the bit line BL1 to the word line $WL1i$. On the other hand, the memory cell MC2 includes a stopper film ST, an electrode EL2, a variable resistor VR, an electrode EL1, a non-ohmic element NO, and a barrier metal BM, which are stacked in a direction from the word line $WL2i$ to the bit line BL1.

The variable resistor VR can vary the resistance value through, for example, current, heat and chemical energy by applying voltage. The electrodes EL1 and EL2 are placed at the upside and the downside of the variable resistor VR. The electrodes EL1 and EL2 function as a barrier metal and an adhesion layer. Examples of the material used for the electrode include Pt, Au, Ag, TiAlN, SrRuO, Ru, RuN, Ir, Co, Ti, TiN, TaN, LaNiO, Al, PtIrOx, PtRhOx, and Rh/TaAlN. A metal film for equalizing the orientation may be also inserted. Further, a buffer layer, a barrier metal layer, an adhesion layer or the like may be inserted.

Utilizable as the variable resistor VR are, more specifically, for example, ones like chalcogenide or the like in which the resistance is varied due to phase transition between a crystalline state and an amorphous state (PCRAM), ones in which the resistance is varied by precipitating metal cations to form a contacting bridge between the electrodes and ionizing the precipitated metal to destroy the contacting bridge (CBRAM), and ones in which the resistance is varied by voltage or current application (broadly divided into ones in which a resistance variation occurs due to presence/absence of a trapped charge in a charge trap existing in an electrode interface and ones in which a resistance variation occurs due to presence/absence of a conductive path induced by oxygen deficiency or the like) (ReRAM).

A heat-resistant and low-resistance material is preferably used as the bit lines $BL0i$ to $BL2i$ and the word lines WL01 and $WL1i$. For example, W, WSi, NiSi, or CoSi may be used for the bit lines $BL0i$ to $BL2i$ and the word lines $WL0i$ and $WL1i$.

Figure 4:
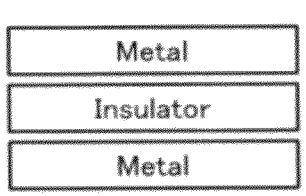
FIG. 4 is a view showing a specific example of a non-ohmic element NO according to an embodiment.
Figure 4:
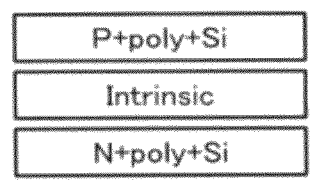

As shown in FIG. 4, the non-ohmic element NO has, for example, (a) a Metal-Insulator-Metal (MIM) structure or (b) a P+poly-Silicon-Intrinsic-N+poly-Silicon (PIN) structure. Here, the electrodes EL2 and EL3 may be also inserted to form a barrier metal layer or an adhesion layer. Further, in the case of the MIM structure, a bipolar operation may be done. When the PIN structure (diode structure) is used, a unipolar operation may be done due to the property of the structure.

The stopper film ST is configured by tungsten (W). The electrodes EL1 and EL2, and the barrier metal BM are configured by titanium (Ti)/titanium nitride (TiN).

Figure 5:
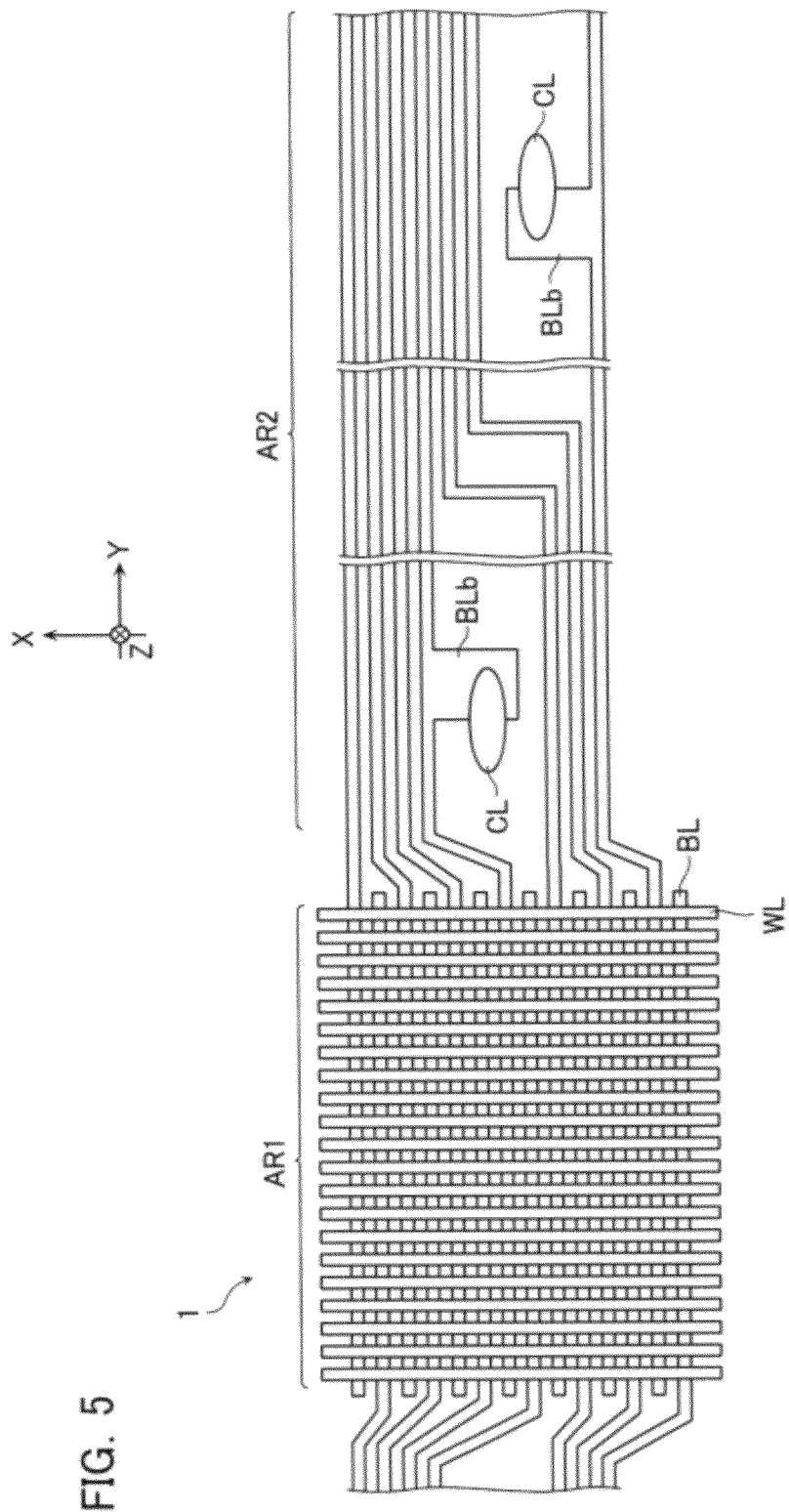
FIG. 5 is a view showing a layout of bit lines BL in a peripheral region AR2.

FIG. 5 is a plan view of the memory cell array region AR1 in which the memory cell array is formed and the peripheral region AR2 in which the bit lines BL and the word lines WL extending from the memory cell array region AR1 are wired. FIG. 5 particularly shows only the layout of the bit lines BL in the peripheral region AR2. Although not shown in FIG. 5, the word lines WL also actually extend in the X-direction shown in FIG. 5.

As shown in FIG. 5, the odd-numbered bit lines BL are pulled from a side of the memory cell array 1 to the peripheral region AR2 and then extend in the Y-direction shown in FIG. 5. Although not shown in FIG. 5, the even-numbered bit lines BL are pulled from the opposite side of the memory cell array 1 to the peripheral region AR2 and then also extend in the Y-direction shown in FIG. 5 as well as the odd-numbered bit lines BL.

The bit lines BL include a hook part BLb that is formed at a part of the side thereof and protrudes in the X-direction. The hook part BLb is provided to contact with a contact plug CL extending in a stacking direction (Z-direction). Although only the two hook parts BLb of the bit lines BL are shown in FIG. 5, the other bit lines BL actually include the same hook part BLb. Although not shown in FIG. 5, the word lines WL also actually include a hook part WLb that is formed at a part of the side thereof and protrudes in the Y-direction.

Figure 6:
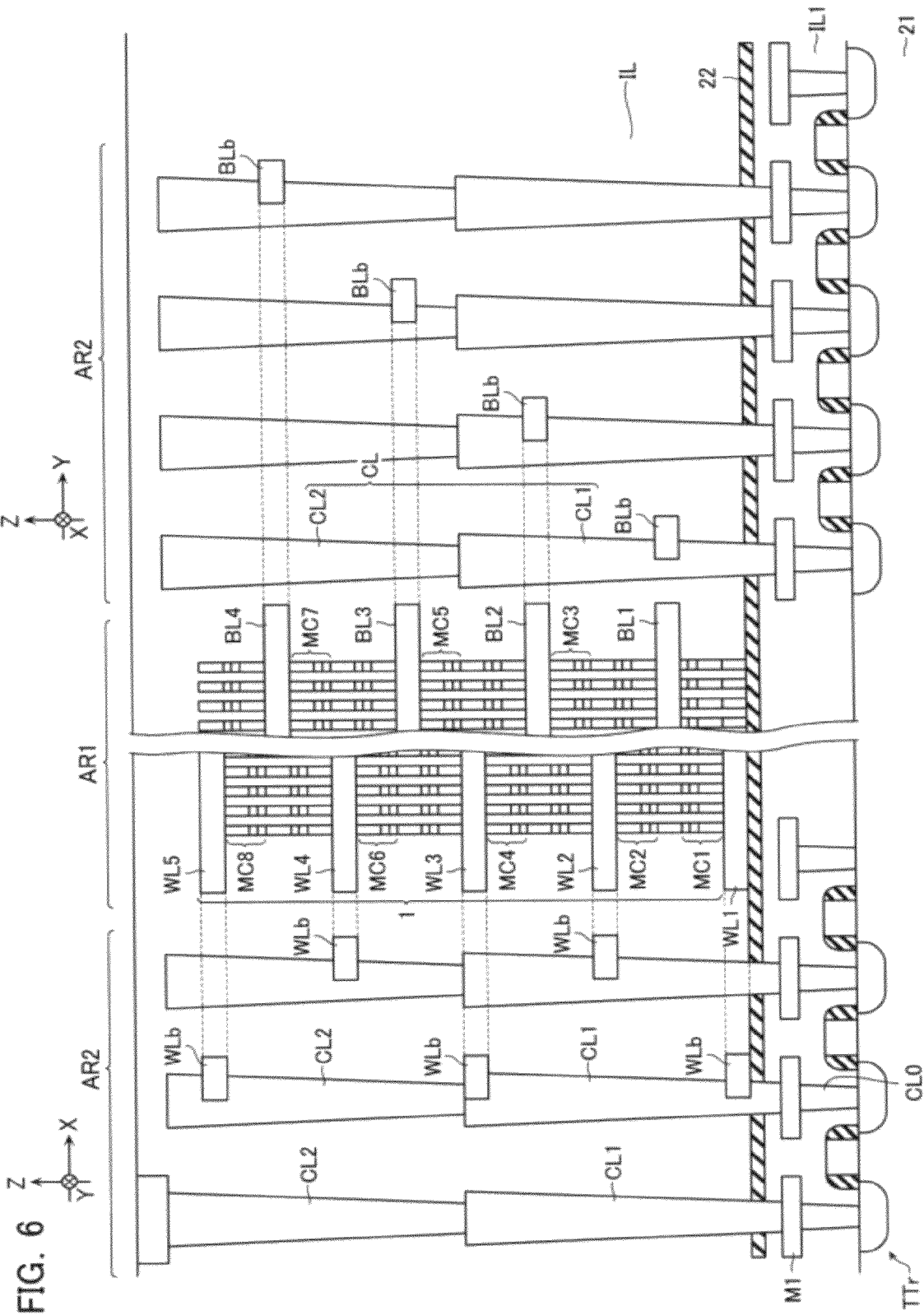
FIG. 6 is a cross-sectional view of a memory cell array region AR1 and the peripheral region AR2.

FIG. 6 is a schematic cross-sectional view of the memory cell array region AR1 and peripheral region AR2 shown in FIG. 5. The cross-sectional surface of the memory cell array region AR1 is shown at the center of FIG. 6. The cross-sectional surface (in the Y-axis direction) of the peripheral region AR2 having the bit lines BL formed therein is shown at the right side of FIG. 6. The cross-sectional surface (in the X-axis direction) of the peripheral region AR2 having the word lines WL formed therein is shown at the left side of FIG. 6. Note that FIG. 6 is an example to show that the five word lines WL1 to WL5 and the four bit lines BL1 to BL4 are provided and an eight-layer memory cell array (MC1 to MC8) is formed between the word lines WL and the bit lines BL.

As shown in FIG. 6, the memory cell array 1 is formed on a silicon nitride film 22. The silicon nitride film 22 is formed on a semiconductor substrate 21 via an interlayer insulator IL1. Transfer transistors TTr and other high breakdown voltage transistors are formed on the semiconductor substrate 21. The transfer transistors TTr configure a column control circuit for selectively supplying a voltage to the bit lines BL. The other transistors configure other circuits. Note that the memory cell array 1 may be directly formed on the interlayer insulator IL1, omitting the silicon nitride film 22.

As shown at the right side of FIG. 6, the bit lines BL are configured to extend in the Y-axis direction and also include the hook parts BLb extending in the X-direction. The hook parts BLb are connected with the contact plugs CL1 or CL2.

In this embodiment, the contact plugs CL1 and CL2 are stacked in the stacking direction to form a contact plug CL (continuous contact structure). As shown at the left side of FIG. 6, the word lines WL are configured to extend in the X-axis direction and also include the hook parts WLb extending in the Y-direction. The hook parts WLb are connected with the contacts plug CL1 or CL2. The contact plug CL penetrates through the silicon nitride film 22 and is connected with a metal wire M1 formed at the lower layer thereof. The metal wire M1 has a contact plug CL0 formed at the lower layer thereof. The contact plug CL0 is connected with the above-mentioned transfer transistor TTr.

As shown in FIG. 6, above and below one hook part BLb, a word line WL and hook part WLb are not formed at a layer lower or higher by one layer than the hook part BLb. Other conductive layers formed at the same layer as the word line WL are not formed therein, either. Only an interlayer insulator IL is formed above and below the hook part BLb. Similarly, above and below one hook part WLb, a bit line BL and hook part BLb are not formed at a layer lower or higher by one layer than the hook part WLb. Other conductive layers formed at the same layer as the bit line BL are not formed therein, either. Only the interlayer insulator IL is formed above and below the hook part WLb. This eliminates (at least, diminishes) the risk of leaving the material of the memory cell MC at the upper layer and the lower layer of the hook part BLb and the hook parts WLb so that the causes of erroneous operations can be reduced.

Next, the manufacturing process for the semiconductor memory device according to the embodiments is described with reference to FIGS. 7 to 13. Note that the process described below is the forming process for the unit cell array MAT01. The unit cell arrays MAT02 to MAT04 are also formed in the same process as the unit cell array MAT01.

Note that the interlayer insulator IL is properly formed in the process shown in FIGS. 8 to 13 as revealed by the description below. However, the interlayer insulator IL is not shown in FIGS. 8 to 13 for the sake of the simplification of the drawings.

The transfer transistors TTr of the peripheral circuit or the like shown in FIG. 6 is formed on the semiconductor substrate 21 and then filled with the interlayer insulator IL1. The surface of the interlayer insulator IL1 is planarized and then the silicon nitride film 22 is deposited thereon.

Figure 7:
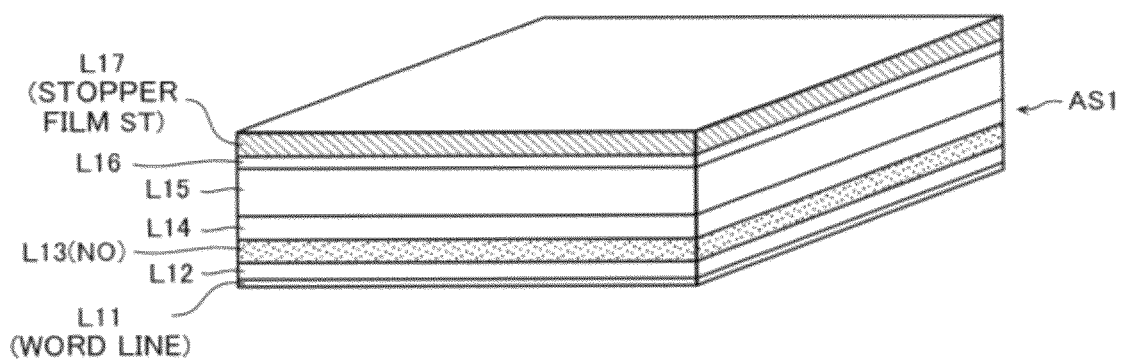
FIG. 7 is a view showing a manufacturing process for a semiconductor memory device according to an embodiment.

Next, layers L11 to L17 are deposited from the bottom to the top on the silicon nitride film 22 to deposit a first stacked-structure AS1 configured by the layers L11 to L17 as shown in FIG. 7 (silicon nitride film 22 is not shown in FIG. 7). Here, the layers L11 to L17 become the word line WL1, the electrode EL2, the variable resistor VR, the electrode EL1, the non-ohmic element NO, the barrier metal BM and the stopper film ST as shown in FIG. 3B, respectively. In other words, the first stacked-structure AS1 is configured to form the memory cell MC1.

Figure 8:
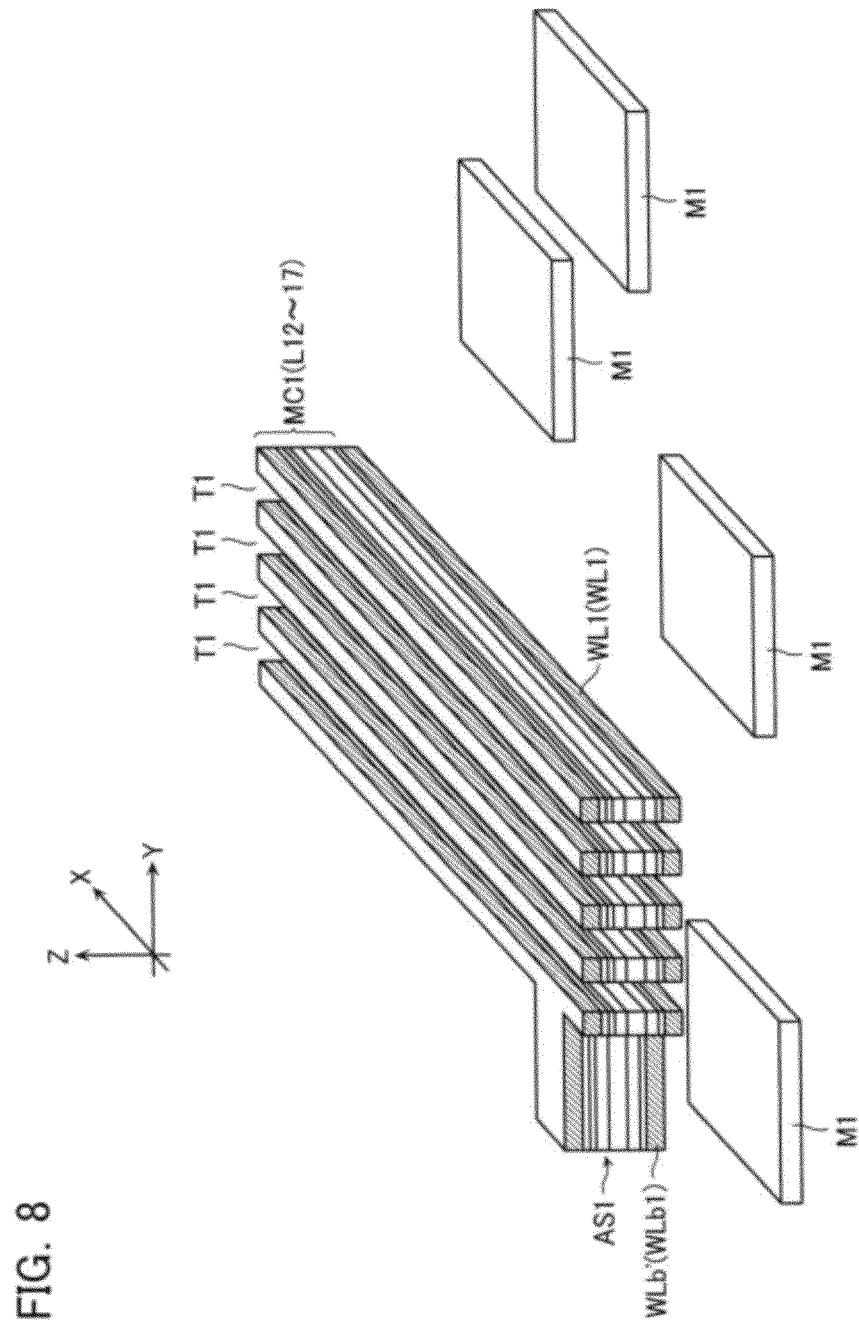
FIG. 8 is a view showing a manufacturing process for a semiconductor memory device according to an embodiment.

Next, a hard mask such as TEOS (not shown) is formed on the upper surface of the first stacked-structure AS1, and anisotropic etching is performed using this hard mask as a mask. Accordingly, trenches T1 are formed at certain pitches in the Y-direction as shown in FIG. 8. The trenches T1 penetrate through the first stacked-structure AS1 (layers L11 to L17) and extend in the X-direction. The layer L11 at the bottom layer of the first stacked-structure AS1 becomes the word line WL1. Note that the metal wire M1 is shown in FIGS. 8 to 13 described below. The metal wire M1 is formed at the lower layer of the memory cell array 1 and silicon nitride film 22 (not shown in FIGS. 8 to 13).

The first stacked-structure AS1 that has been formed into a stripe pattern (first stripe part) extending in the X-direction in this manner is configured to have a projecting part WLb' formed at a part thereof. The projecting part WLb' projects in the Y-direction. The projecting part WLb' becomes the hook part WLb1 (first hook part). Note that each of the stripe parts actually has the projecting part WLb' although only one of the stripe parts has the projecting part WLb' in FIG. 8. Note that, when the first stacked-structure AS1 is etched, the etching is conducted to completely remove the first stacked-structure AS1 in the region to form the hook part BLb1 thereabove. This prevents the materials of the memory cell MC from remaining at the lower layers of the hook part BLb1.

Next, the trenches T1 are filled with the interlayer insulator IL. The material of the interlayer insulator IL is preferably highly insulating, low capacitance and easily filled. Then, the interlayer insulator IL is planarized by chemical mechanical polishing (CMP) or the like to remove unnecessary parts of the interlayer insulator IL and to expose the layer L17. Here, the layer L17 (to become the stopper film ST) functions to stop the planarization by CMP at a certain position in the stacking direction.

Figure 9:
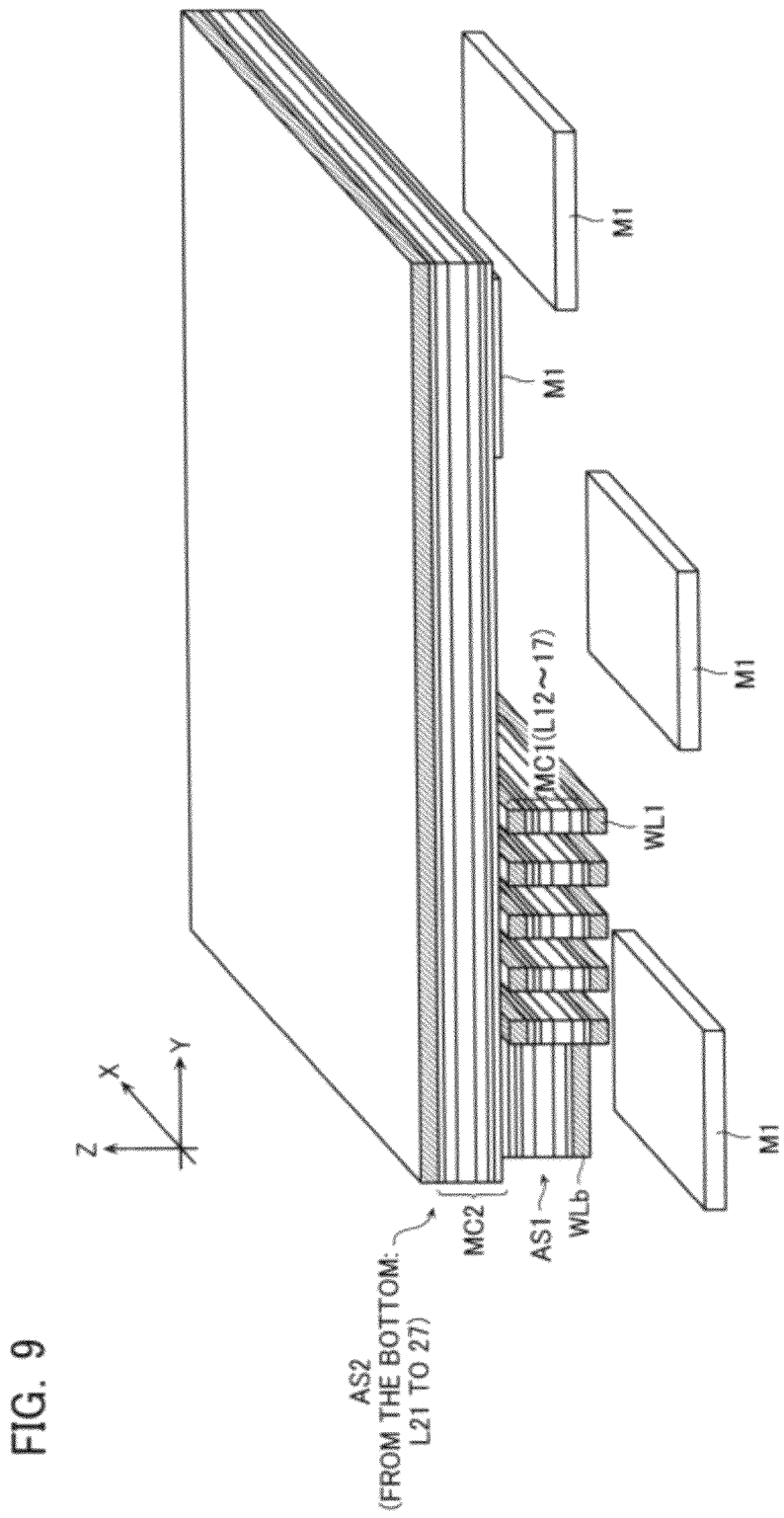
FIG. 9 is a view showing a manufacturing process for a semiconductor memory device according to an embodiment.

Next, as shown in FIG. 9, layers L21 to L27 are deposited in this order from the bottom to the top on the interlayer insulator IL planarized by CMP and the first stacked-structure AS1 to configure a second stacked-structure AS2. The layers L21 to L27 become the bit line BL1, the barrier metal BM, the non-ohmic element NO, the electrode EL1, the variable resistor VR, the electrode EL2 and the stopper film ST, constituting the memory cell MC2 later.

Figure 10:
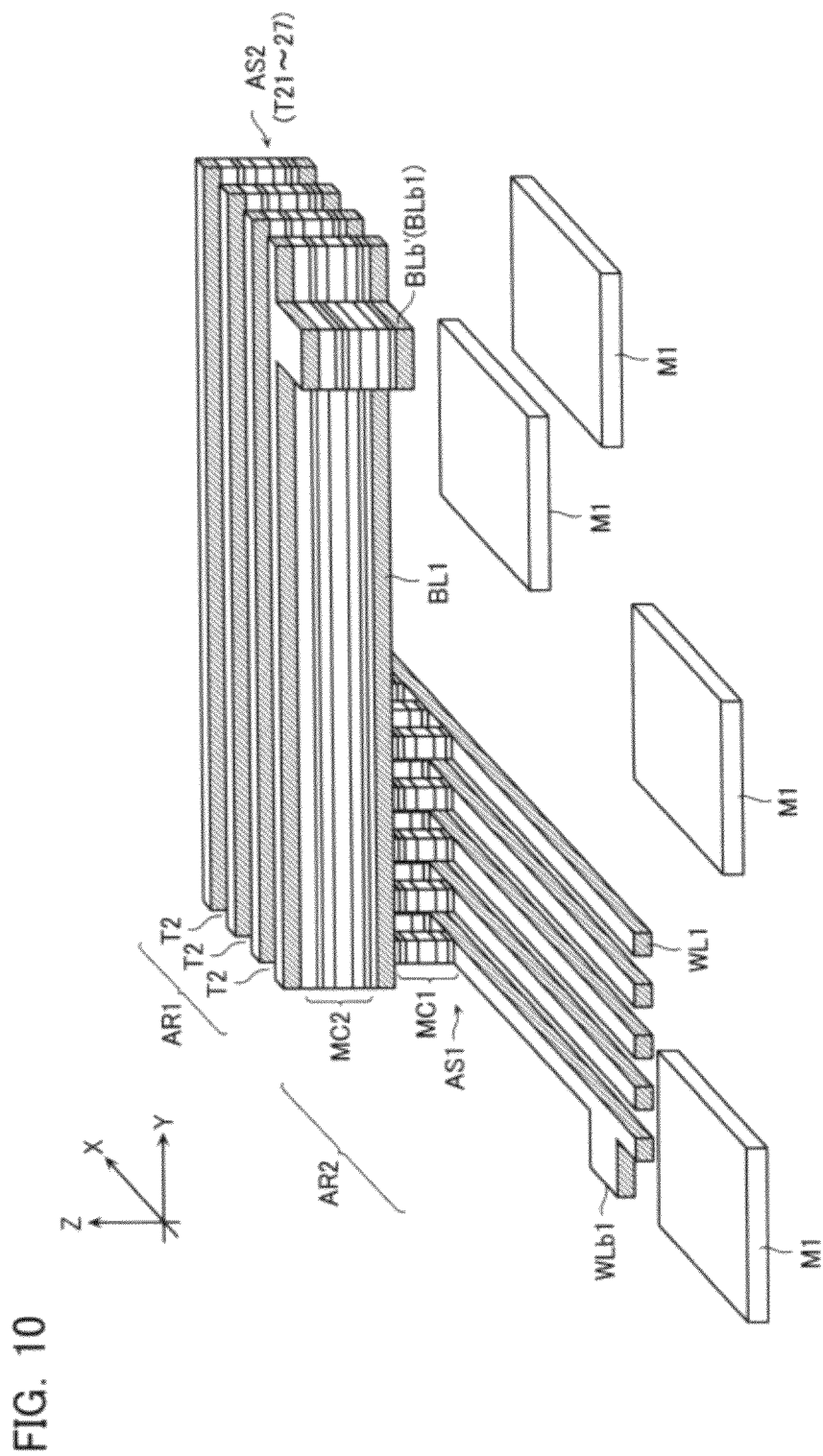
FIG. 10 is a view showing a manufacturing process for a semiconductor memory device according to an embodiment.

Next, a hard mask such as TEOS (not shown) is formed on the upper surface of the second stacked-structure AS2, and anisotropic etching is performed using this hard mask as a mask. Accordingly, trenches T2 are formed and aligned at certain pitches in the X-direction as shown in FIG. 10. The trenches T2 penetrate through the layers L21 to L27 and the layers L12 to L17 and extend in the Y-direction. The layer L21 at the bottom layer of the second stacked-structure AS2 becomes the bit line BL1. The layers L12 to L17 becomes the memory cell MC1 that is aligned in a matrix pattern by this process. Further, the mask is not formed at the peripheral region AR2 so that all of the first stacked-structure AS1 and second stacked-structure AS2 of the peripheral region AR2 are removed except for the bottom layer 11, that is, the word lines WL1 and the hook parts WLb1. In other words, the structure of the memory cell MC does not remain above the hook parts WLb1 of the first stacked-structure AS1.

Note that, when the second stacked-structure AS2 is etched, the etching is conducted to completely remove the second stacked-structure AS2 in the region to form the hook part WLb2 thereabove. This prevents the materials of the memory cell MC from remaining at the lower layers of the hook part WLb2.

Further, the second stacked-structure AS2 that has been formed into a stripe pattern extending in the Y-direction in this manner is configured to have a projecting part BLb' formed at a part thereof. The projecting part BLb' projects in the X-direction. The projecting part BLb' becomes the hook part BLb1 described above. Note that each of the stripe parts actually has the projecting part BLb' although only one of the stripe parts has the projecting part BLb' in FIG. 10.

Next, the interlayer insulator IL is deposited to fill the memory cell array region AR1 and the peripheral region AR2 shown in FIG. 10 including the trenches T2. Then, the interlayer insulator IL is planarized by CMP to remove unnecessary parts of the interlayer insulator IL and expose the layer L27 (stopper film ST). As described above, all of the materials stacked above the hook parts WLb1 of the first stacked-structure AS1 have been removed so that only the interlayer insulator IL is formed on the hook parts WLb1 of the first stacked-structure AS1.

Figure 11:
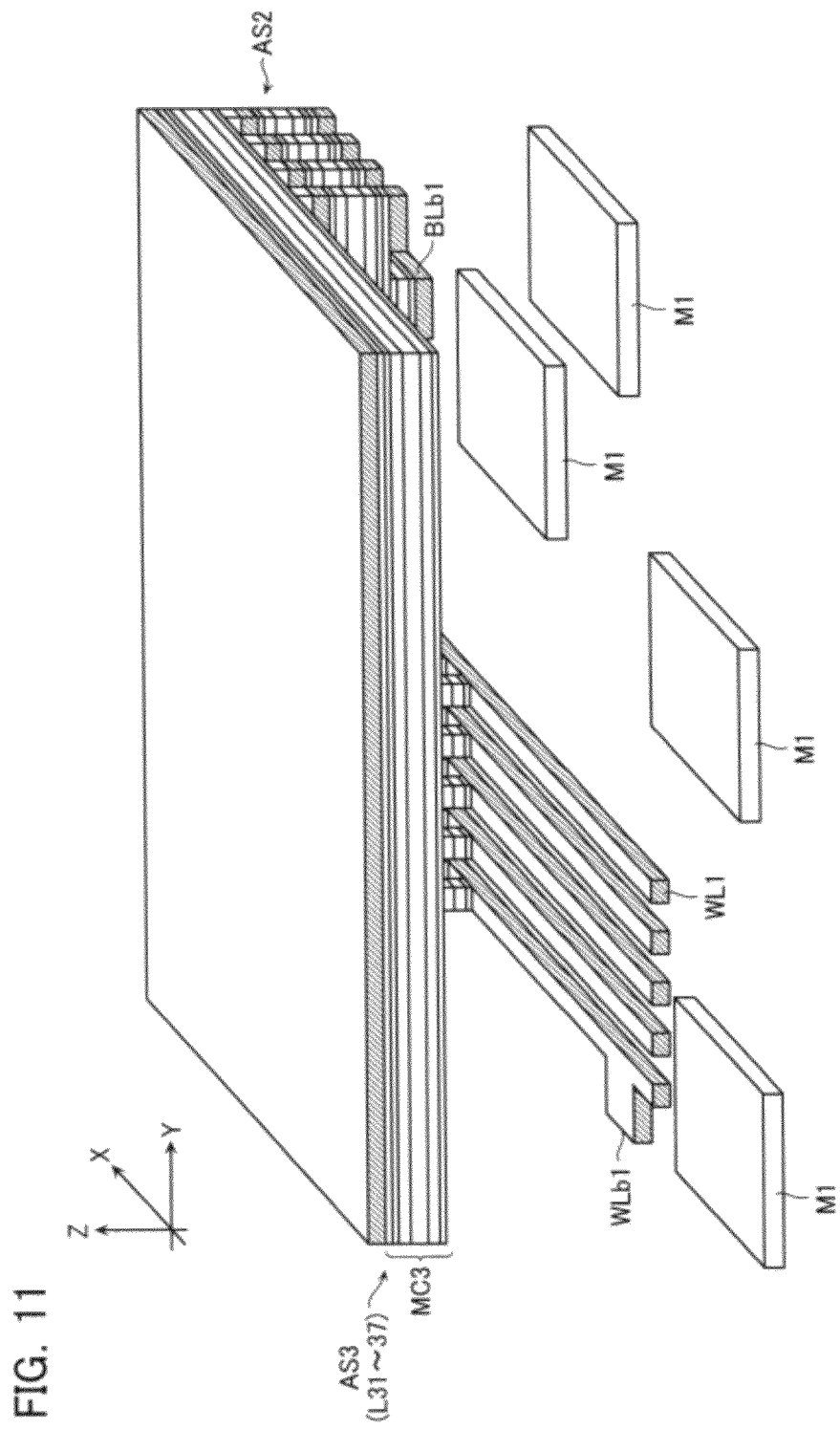
FIG. 11 is a view showing a manufacturing process for a semiconductor memory device according to an embodiment.

Next, as shown in FIG. 11, layers L31 to L37 are sequentially deposited on the interlayer insulator IL planarized by CMP in order to deposit a third stacked-structure AS3 configured by the layers L31 to L37. Here, the layers L31 to L37 become the word line WL2, the electrode EL2, the variable resistor VR, the electrode EL1, the non-ohmic element NO, the barrier metal BM and the stopper film ST, respectively.

Figure 12:
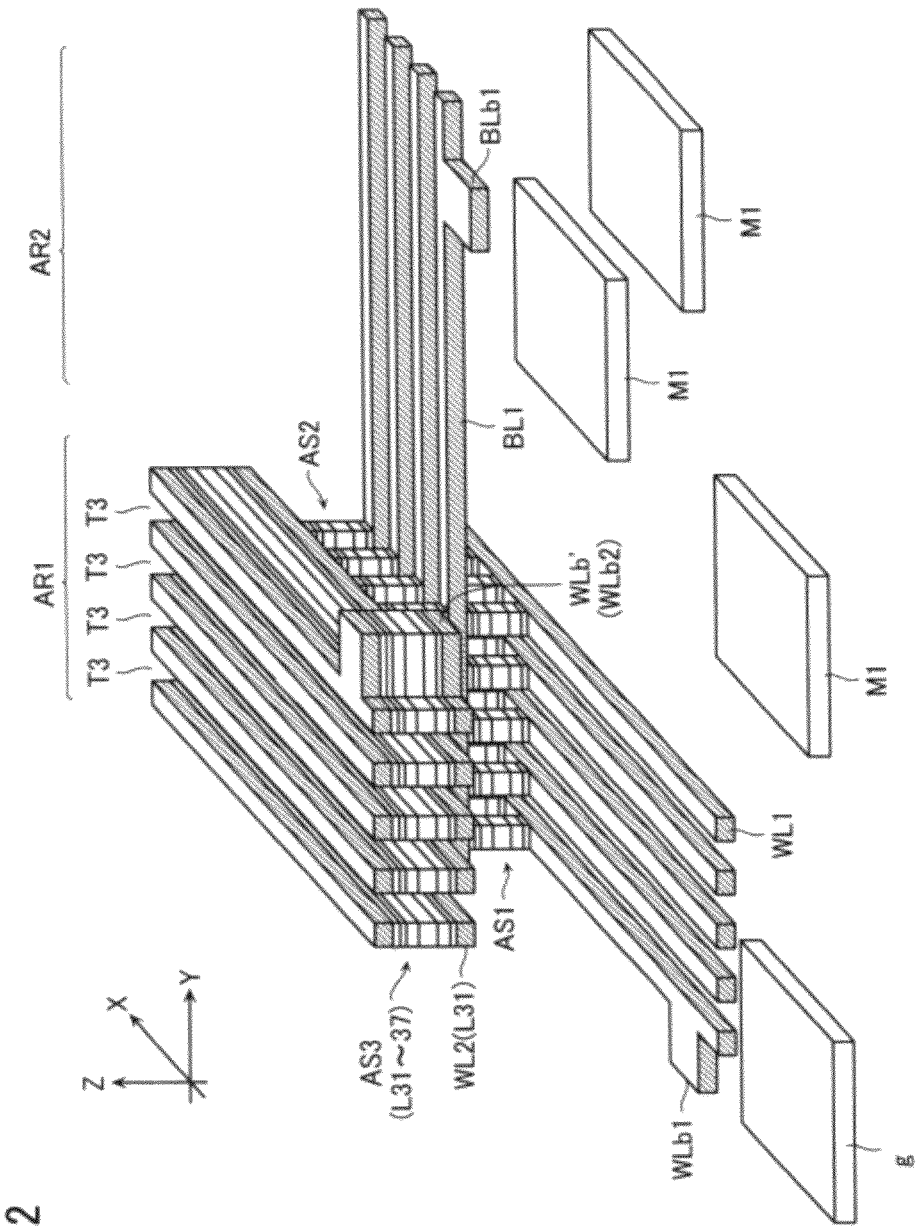
FIG. 12 is a view showing a manufacturing process for a semiconductor memory device according to an embodiment.

Next, a hard mask such as TEOS (not shown) is formed on the upper surface of the third stacked-structure AS3, and anisotropic etching is performed using this hard mask as a mask. Accordingly, trenches T3 are formed at certain pitches as shown in FIG. 12. The trenches T3 penetrate through the layers L31 to L37 and the layers L22 to L27 and extend in the row direction (X-direction). Here, the layer L31 becomes the word line WL2.

The third stacked-structure AS3 that has been formed into a stripe pattern extending in the X-direction in this manner is configured to have a projecting part WLb' formed at a part thereof. The projecting part WLb' projects in the Y-direction. Note that, when the third stacked-structure AS3 is etched, the etching is conducted to completely remove the third stacked-structure AS3 in the region to form the hook part BLb thereabove. This prevents the materials of the memory cell MC from remaining at the lower layers of the hook part BLb.

Further, the mask is not formed at the peripheral region AR2 so that all of the second stacked-structure AS2 and third stacked-structure AS3 of the peripheral region AR2 are removed except for the bottom layer 21, that is, the bit lines BL1 and the hook parts BLb1. In other words, the materials configuring the memory cell MC do not remain above the hook parts BLb1.

As described above, in the manufacturing process of the embodiments, the following steps are repeated as many times as the number of necessary layers.

(1) A step of forming a stacked-structure ASi including the word lines WL.

(2) A step of etching the stacked-structure ASi into a stripe pattern extending in the X-direction in order to form stripe parts. The stripe parts extend in the X-direction and are aligned at certain pitches in the Y-direction to form the word lines WL. In the step, hook parts WLb' are also formed at the stacked-structure ASi, projecting from the side of the stripe parts in the Y-direction (note that, when a stacked-structure ASi−1 has been already formed at the lower layer of the stacked-structure ASi, the stacked-structure ASi−1 is also etched into a stripe pattern extending in the X-direction. Accordingly, a memory cell structure that is aligned in a matrix pattern is formed in the stacked-structure ASi−1. Further, the stacked-structure ASi−1 at the peripheral region AR2 is removed except for the bit lines BL and the hook parts BLb).

(3) A step of forming a stacked-structure ASi+1 including the bit lines BL on the stacked-structure ASi.

(4) A step of etching the stacked-structure ASi+1 into a stripe pattern extending in the Y-direction in order to form stripe parts. The stripe parts extend in the Y-direction and are aligned at certain pitches in the X-direction to form the bit lines BL. In the step, hook parts BLb' are also formed at the stacked-structure ASi+1, projecting from the side of the stripe parts in the X-direction (note that the stacked-structure ASi under the stacked-structure ASi+1 is also etched into a stripe pattern extending in the Y-direction in order to form a memory cell structure in a matrix pattern in the stacked-structure ASi. Further, the stacked-structure ASi at the peripheral region AR2 is removed except for the word lines WL and the hook parts WLb).

Note that in the peripheral region AR2, the top layer, that is, the stacked-structure ASi+n−1 is removed except for the part to become the bit lines BL or the word lines WL.

According to such steps, above and below a hook part BLb, a word line WL and hook part WLb are not formed at a layer lower or higher by one layer than the hook part BLb. Other conductive layers formed at the same layer as the word line WL are not formed therein, either. Only an interlayer insulator IL is formed above and below the hook part BLb. Similarly, above and below a hook part WLb, a bit line BL and hook part BLb are not formed at a layer lower or higher by one layer than the hook part WLb. Other conductive layers formed at the same layer as the bit line BL are not formed therein, either. Only the interlayer insulator IL is formed above and below the hook part WLb.

Figure 13:
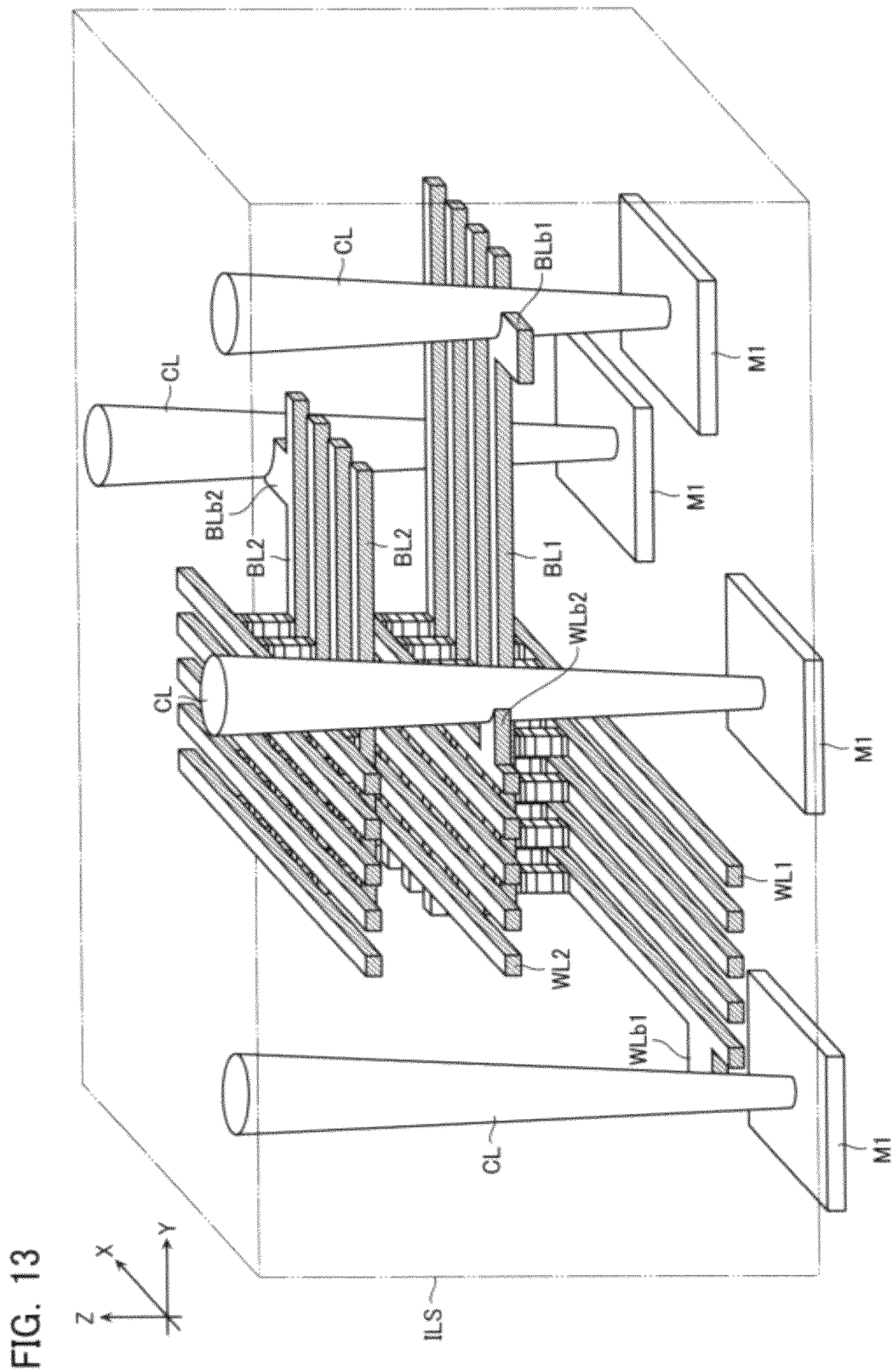
FIG. 13 is a view showing a manufacturing process for a semiconductor memory device according to an embodiment.

A stacked-structure AS having a certain number of layers is formed in this manner, followed by forming the contact plugs CL as shown in FIG. 13.

The contact plug CL is formed by filling a contact hole with a conductive film such as tungsten. The contact hole penetrates the interlayer insulator IL and is formed in a region passing through the hook parts WLb and BLb. The step of forming the contact plug CL is repeated after each step in which a certain number of the stacked-structure AS including word lines WL and the stacked-structure ASi+1 including bit lines are formed and etched, and the bit lines BL or the word lines WL are formed into a stripe pattern on the certain number of stacked-structures ASi and ASi+1. Thus, the contact plug CL has a structure in which a plurality of contact plugs CL1, CL2, . . . , is stacked.

Figure 14:
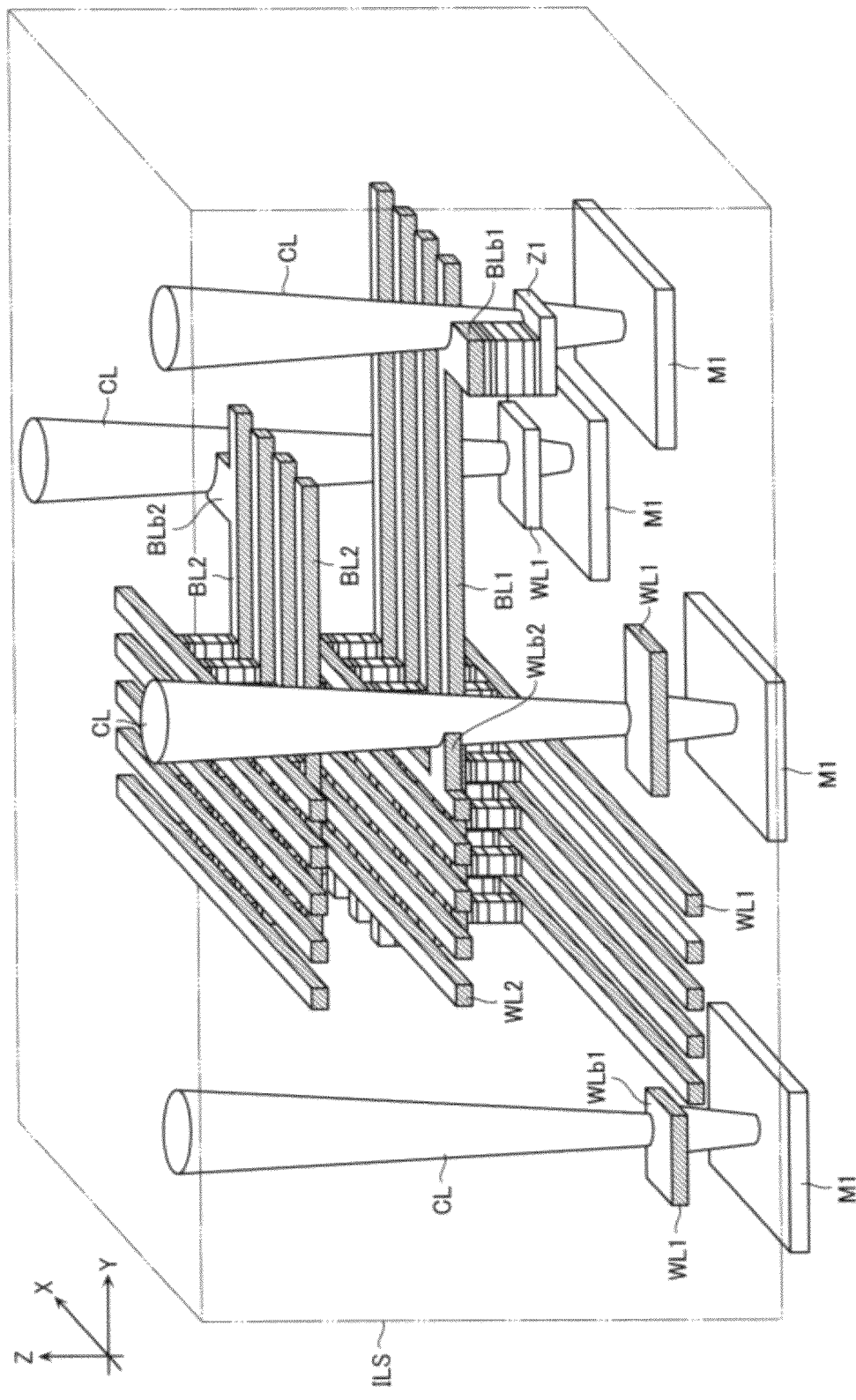
FIG. 14 is a view showing a comparative example of an embodiment.

FIG. 14 shows a comparative example of the present embodiments. In the comparative example, the hook parts BLb1 formed at the bit lines BL1 have wire parts Z1 formed at the same layer as the word lines WL1 formed at the layer just one layer lower than the bit lines BL1. If the wire parts Z1 remain at the layer just one layer lower than the hook parts BLb1 like this, the materials to form a memory cell MC sometimes remain between the wire parts Z1 and the hook parts BLb1. In such a case, there is a risk in which the remaining materials of the memory cell MC cause an erroneous operation or the like. On the other hand, in the present embodiments, the manufacturing step is conducted not to leave such wire parts Z1 on each of the upper and lower layers of the hook parts WLb and BLb so that an erroneous operation due to the remaining materials of the memory cell MC does not occur.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, comprising a plurality of first lines, a plurality of second lines crossing the plurality of first lines, and a cell array having memory cells, each of the memory cells being connected with the first line and the second line at respective intersections of the first lines and the second lines, the method comprising:

forming a first stacked-structure by sequentially stacking a first line layer forming the first line and a memory cell layer forming the memory cell;

forming a first stripe part and a first hook part at the first stacked-structure by etching the first stacked-structure into a stripe pattern extending in a first direction, the first stripe part extending in the first direction and being aligned at a certain pitch in a second direction perpendicular to the first direction, and the first hook part protruding from a side of the first stripe part in the second direction;

forming a second stacked-structure on the first stacked-structure by sequentially stacking a second line layer forming the second line and the memory cell layer;

forming a second stripe part and a second hook part at the second stacked-structure by etching the second stacked-structure into a stripe pattern extending in the second direction, the second stripe part extending in the second direction and being aligned at a certain pitch in the first direction, and the second hook part protruding from a side of the second stripe part in the first direction;

repeating the above-described four steps for a certain number of times; and forming a contact plug contacting a side of the first hook part or a side of the second hook part and extending in a stacking direction perpendicular to the first direction and the second direction, when there is the second stacked-structure under the first stacked-structure in etching the first stacked-structure, the second stacked-structure being etched into a stripe pattern extending in the first direction to form the memory cell into a matrix pattern in the second stacked-structure, when there is the first stacked-structure under the second stacked-structure in etching the second stacked-structure, the first stacked-structure being etched into a stripe pattern extending in the second direction to form the memory cell into a matrix pattern in the first stacked-structure, in etching the first stacked-structure, the etching being conducted to remove the first stacked-structure in a region at which the second hook part is to be formed in the second stacked-structure higher than the first stacked-structure by one layer, and in etching the second stacked-structure, the etching being conducted to remove the second stacked-structure in a region at which the first hook part is to be formed in the first stacked-structure higher than the second stacked-structure by one layer.

2. The method of manufacturing a semiconductor memory device according to claim 1, wherein in etching the first stacked-structure, the etching is conducted to remove the memory cell layer formed at the second hook part located under the first stacked-structure, and in etching the second stacked-structure, the etching is conducted to remove the memory cell layer formed at the first hook part located under the second stacked-structure.

3. The method of manufacturing a semiconductor memory device according to claim 1, wherein the contact plug is formed every time after a certain number of forming and etching of the first stacked-structure and the second stacked-structure are completed.

4. The method of manufacturing a semiconductor memory device according to claim 1, wherein the contact plug is formed every time after a certain number of forming and etching of the first stacked-structure and the second stacked-structure are completed, and thereafter forming of the first lines or the second lines into a stripe pattern above the certain number of the first stacked-structures and the second stacked-structures is completed.

5. The method of manufacturing a semiconductor memory device according to claim 4, wherein in etching the first stacked-structure, the etching is conducted to remove the memory cell layer formed at the second hook part located under the first stacked-structure, and in etching the second stacked-structure, the etching is conducted to remove the memory cell layer formed at the first hook part located under the second stacked-structure.

6. The method of manufacturing a semiconductor memory device according to claim 1, wherein the memory cell layer is configured by a variable resistor and a non-ohmic element connected in series.

7. The method of manufacturing a semiconductor memory device according to claim 1, wherein the first stacked-structure and the second stacked-structure are anisotropically etched.

8. A method of manufacturing a semiconductor memory device, comprising a plurality of first lines, a plurality of second lines crossing the plurality of first lines, and a cell array having memory cells, each of the memory cells being connected with the first line and the second line at respective intersections of the first lines and the second lines, the method comprising:

forming a first stacked-structure by sequentially stacking a first line layer forming the first line and a memory cell layer forming the memory cell;

forming a first stripe part and a first hook part at the first stacked-structure by etching the first stacked-structure into a stripe pattern extending in a first direction, the first stripe part extending in the first direction and being aligned at a certain pitch in a second direction perpendicular to the first direction, and the first hook part protruding from a side of the first stripe part in the second direction;

forming a second stacked-structure on the first stacked-structure by sequentially stacking a second line layer forming the second line and the memory cell layer;

forming a second stripe part and a second hook part at the second stacked-structure by etching the second stacked-structure into a stripe pattern extending in the second direction, the second stripe part extending in the second direction and being aligned at a certain pitch in the first direction, and the second hook part protruding from a side of the second stripe part in the first direction;

repeating the above-described four steps for a certain number of times; and forming a contact plug contacting a side of the first hook part or a side of the second hook part and extending in a stacking direction perpendicular to the first direction and the second direction, when there is the second stacked-structure under the first stacked-structure in etching the first stacked-structure, the second stacked-structure being etched into a stripe pattern extending in the first direction to form the memory cell into a matrix pattern in the second stacked-structure, when there is the first stacked-structure under the second stacked-structure in etching the second stacked-structure, the first stacked-structure being etched into a stripe pattern extending in the second direction to form the memory cell into a matrix pattern in the first stacked-structure, in etching the first stacked-structure, the etching being conducted to remove the first stacked-structure in all regions except for the first stripe part and the first hook part, and in etching the second stacked-structure, the etching being conducted to remove the second stacked-structure in all regions except for the second stripe part and the second hook part.

9. The method of manufacturing a semiconductor memory device according to claim 8, wherein in etching the first stacked-structure, the etching is conducted to remove the memory cell layer formed at the second hook part located under the first stacked-structure, and in etching the second stacked-structure, the etching is conducted to remove the memory cell layer formed at the first hook part located under the second stacked-structure.

10. The method of manufacturing a semiconductor memory device according to claim 8, wherein the contact plug is formed every time after a certain number of forming and etching of the first stacked-structure and the second stacked-structure are completed.

11. The method of manufacturing a semiconductor memory device according to claim 8, wherein the contact plug is formed every time after a certain number of forming and etching of the first stacked-structure and the second stacked-structure are completed, and thereafter forming of the first lines or the second lines into a stripe pattern above the certain number of the first stacked-structures and the second stacked-structures is completed.

12. The method of manufacturing a semiconductor memory device according to claim 11, wherein in etching the first stacked-structure, the etching is conducted to remove the memory cell layer formed at the second hook part located under the first stacked-structure, and in etching the second stacked-structure, the etching is conducted to remove the memory cell layer formed at the first hook part located under the second stacked-structure.

13. The method of manufacturing a semiconductor memory device according to claim 8, wherein the memory cell layer is configured by a variable resistor and a non-ohmic element connected in series.

14. The method of manufacturing a semiconductor memory device according to claim 8, wherein the first stacked-structure and the second stacked-structure are anisotropically etched.

15. A semiconductor memory device comprising:

a plurality of first lines;

a plurality of second lines crossing the plurality of first lines and disposed between the plurality of first lines in a stacking direction; and a cell array having memory cells, each of the memory cells being connected with the first line and the second line at respective intersections of the first lines and the second lines, each of the first lines being shared by the memory cells that are located at an upside and a downside thereof, each of the second lines being shared by the memory cells that are located at an upside and a downside thereof, the first lines having a first stripe part and a first hook part, the first stripe part extending in a first direction and being aligned at a certain pitch in a second direction perpendicular to the first direction, and the first hook part protruding from a side of the first stripe part in the second direction, the second lines having a second stripe part and a second hook part, the second stripe part extending in the second direction and being aligned at a certain pitch in the first direction, and the second hook part protruding from a side of the second stripe part in the first direction, above and below the first hook part, the second stripe part and the second hook part of the second lines at a layer just one layer lower or just one layer higher than the first hook part being absent, and above and below the second hook part, the first stripe part and the first hook part of the first lines at a layer just one layer lower or just one layer higher than the second hook part being absent.

16. The semiconductor memory device according to claim 15, further comprising a plurality of the cell arrays stacked in the stacking direction perpendicular to the first direction and the second direction.

17. The semiconductor memory device according to claim 15, wherein the memory cell is configured to connect with only the first stripe part of the first lines and is configured to connect with only the second stripe part of the second lines.

18. The semiconductor memory device according to claim 15, further comprising a contact plug contacting with a side of the first hook part or a side of the second hook part and extending in the stacking direction perpendicular to the first direction and the second direction.

19. The semiconductor memory device according to claim 18, wherein the contact plug has a continuous contact structure in which a plurality of contacts is stacked in the stacking direction.

20. The semiconductor memory device according to claim 15, wherein the memory cell has a variable resistor and a non-ohmic element connected in series.

* * * * *